US008875588B2

(12) United States Patent
Kim et al.

(10) Patent No.: US 8,875,588 B2
(45) Date of Patent: Nov. 4, 2014

(54) MANIFOLD SENSING APPARATUS FOR STEERING

(75) Inventors: Yong Chul Kim, Gyeonggi-go (KR); Chang Hwan Lee, Gyeongsangbuk-do (KR)

(73) Assignee: LG Innotek Co., Ltd., Seoul (KR)

( * ) Notice: Subject to any disclaimer, the term of this patent is extended or adjusted under 35 U.S.C. 154(b) by 788 days.

(21) Appl. No.: 13/059,669

(22) PCT Filed: Jul. 15, 2009

(86) PCT No.: PCT/KR2009/003883
§ 371 (c)(1),
(2), (4) Date: May 10, 2011

(87) PCT Pub. No.: WO2010/021458
PCT Pub. Date: Feb. 25, 2010

(65) Prior Publication Data
US 2011/0214515 A1    Sep. 8, 2011

(30) Foreign Application Priority Data
Aug. 19, 2008   (KR) .................. 10-2008-0080966

(51) Int. Cl.
| | |
|---|---|
| *G01L 3/00* | (2006.01) |
| *H05K 3/36* | (2006.01) |
| *G01D 5/14* | (2006.01) |
| *G01L 5/22* | (2006.01) |
| *B62D 15/02* | (2006.01) |
| *G01D 5/04* | (2006.01) |
| *B62D 6/10* | (2006.01) |
| *H05K 3/30* | (2006.01) |

(52) U.S. Cl.
CPC .... *B62D 15/0215* (2013.01); *H05K 2201/2018* (2013.01); *H05K 3/366* (2013.01); *G01D 5/145* (2013.01); *G01L 5/221* (2013.01); *H05K 2201/048* (2013.01); *H05K 3/301* (2013.01); *G01D 5/04* (2013.01); *B62D 6/10* (2013.01)
USPC .................................................. 73/862.325

(58) Field of Classification Search
USPC ..................... 73/862.325; 439/567
See application file for complete search history.

(56) References Cited

U.S. PATENT DOCUMENTS 3,829,741 A * 8/1974 Athey ........................... 361/756
4,230,385 A * 10/1980 Ammon et al. ................ 439/78

(Continued)

FOREIGN PATENT DOCUMENTS

JP     1994-270824         9/1994
KR     10-1994-021343 B1   10/1994

(Continued)

OTHER PUBLICATIONS

Authors: Yoshiyuki Nomura, Yasushi Saitoh, Kingo Furukawa, Yoshinori Minami, Kanji Horiuchi and Yasuhiro Hattori, Title: Development of Press-fit Connector for Automobile Applications, Date: Dec. 2006, Publication: SEI Technical Review, Volume: No. 63, pp. 33-39.*

*Primary Examiner* — Lisa Caputo
*Assistant Examiner* — Roger Hernandez-Prewit
(74) *Attorney, Agent, or Firm* — Saliwanchik, Lloyd & Eisenschenk

(57) ABSTRACT

Provided is a complex sensing apparatus for a steering system. In the complex sensing apparatus in accordance, since an insertion projections of a first PCB are inserted into a through-holes of a second PCB to be press-fitted to each other, the first PCB is securely coupled to the second PCB. In addition, since a support member configured to surround and support an edge of the first PCB is coupled to the second PCB, the first PCB is more securely coupled to the second PCB. Accordingly, since there is no probability of separating the first PCB from the second PCB and there is no probability of occurrence of cracks in a soldered part between the first and second PCBs, reliability of products can be improved.

9 Claims, 3 Drawing Sheets

(56) References Cited

U.S. PATENT DOCUMENTS 6,510,750 B2 1/2003 Schlabach et al.
7,095,198 B1 8/2006 O'Brien

FOREIGN PATENT DOCUMENTS

KR 20-2000-0016844 Y1 9/2000
WO WO-2008/001193 A2 1/2008

* cited by examiner

MANIFOLD SENSING APPARATUS FOR STEERING

CROSS-REFERENCE TO RELATED APPLICATION

This application is the U.S. national stage application of International Patent Application No. PCT/KR2009/003883, filed Jul. 15, 2009, which claims priority to Korean Application No. 10-2008-0080966, filed Aug. 19, 2008, the disclosures of each of which are incorporated herein by reference in their entirety.

BACKGROUND

1. Field of the Invention

The present invention relates to a complex sensing apparatus for a steering system.

2. Discussion of Related Art

A power steering system for a vehicle is an apparatus for changing a direction of a steering wheel to change a direction in which a running vehicle progresses. Since a steering level of the running vehicle is used as data for controlling the vehicle, a steering torque and a steering angle are sensed to detect the steering level of the vehicle. A complex sensing apparatus for a steering system refers to an apparatus for sensing a steering torque and a steering angle of a vehicle, etc.

A steering torque sensing apparatus and a steering angle sensing apparatus of a conventional complex sensing apparatus for a steering system have first and second printed circuit boards (PCBs) provided with sensors configured to detect variation in magnetic flux according to rotation of a magnet.

In the conventional complex sensing apparatus for a steering system, the first PCB in which a sensor for detecting a steering torque is installed is vertically installed on the second PCB in which a sensor for detecting a steering angle is installed, and soldered to connect patterns.

However, since a coupling force between the first and second PCBs is weak due to their coupling structure, the first PCB may be separated from the second PCB due to vibrations, impacts, or the like. In addition, when the first and second PCBs are moved by the vibrations, impacts, or the like, cracks may occur in a soldered part for connecting the first and second PCBs, and a short circuit may occur. As a result, reliability of products may be decreased.

SUMMARY OF THE INVENTION

In order to solve the problems, the present invention is directed to a complex sensing apparatus for a steering system capable of improving reliability of products.

In order to accomplish the above aspect, a complex sensing apparatus for a steering system includes: a first printed circuit board (PCB) at which a sensor for detecting a steering torque is installed; and a second PCB perpendicularly disposed at the first PCB and at which a sensor for detecting a steering angle is installed. Here, an insertion projection is formed at an end of the first PCB and a through-hole is formed in the second PCB to correspond to the insertion projection such that the insertion projection is press-fitted into the through-hole.

BRIEF DESCRIPTION OF THE DRAWINGS

The above and other objects, features and advantages of the present invention will become more apparent to those of ordinary skill in the art by describing in detail example embodiments thereof with reference to the attached drawings, in which.

DETAILED DESCRIPTION OF EXAMPLE EMBODIMENTS

Hereinafter, a complex sensing apparatus for a steering system in accordance with an exemplary embodiment of the present invention will be described with reference to the accompanying drawings.

Figure 1:
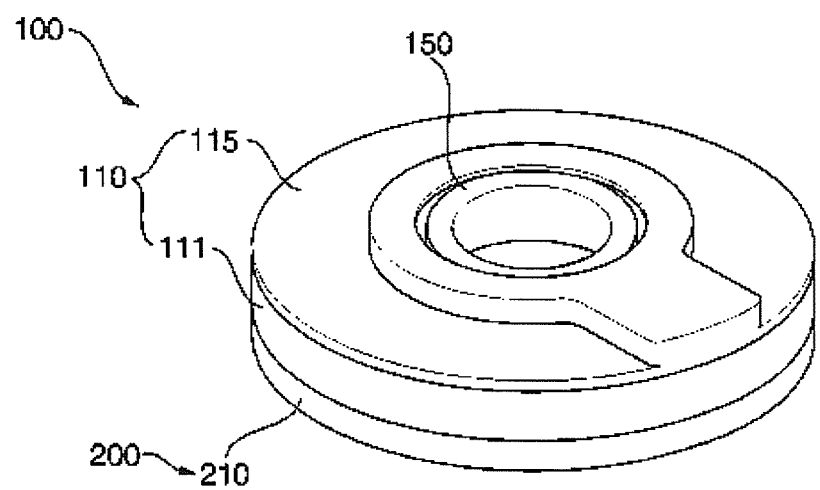
FIG. 1 is a perspective view of a complex sensing apparatus for a steering system in accordance with an exemplary embodiment of the present invention.
Figure 2:
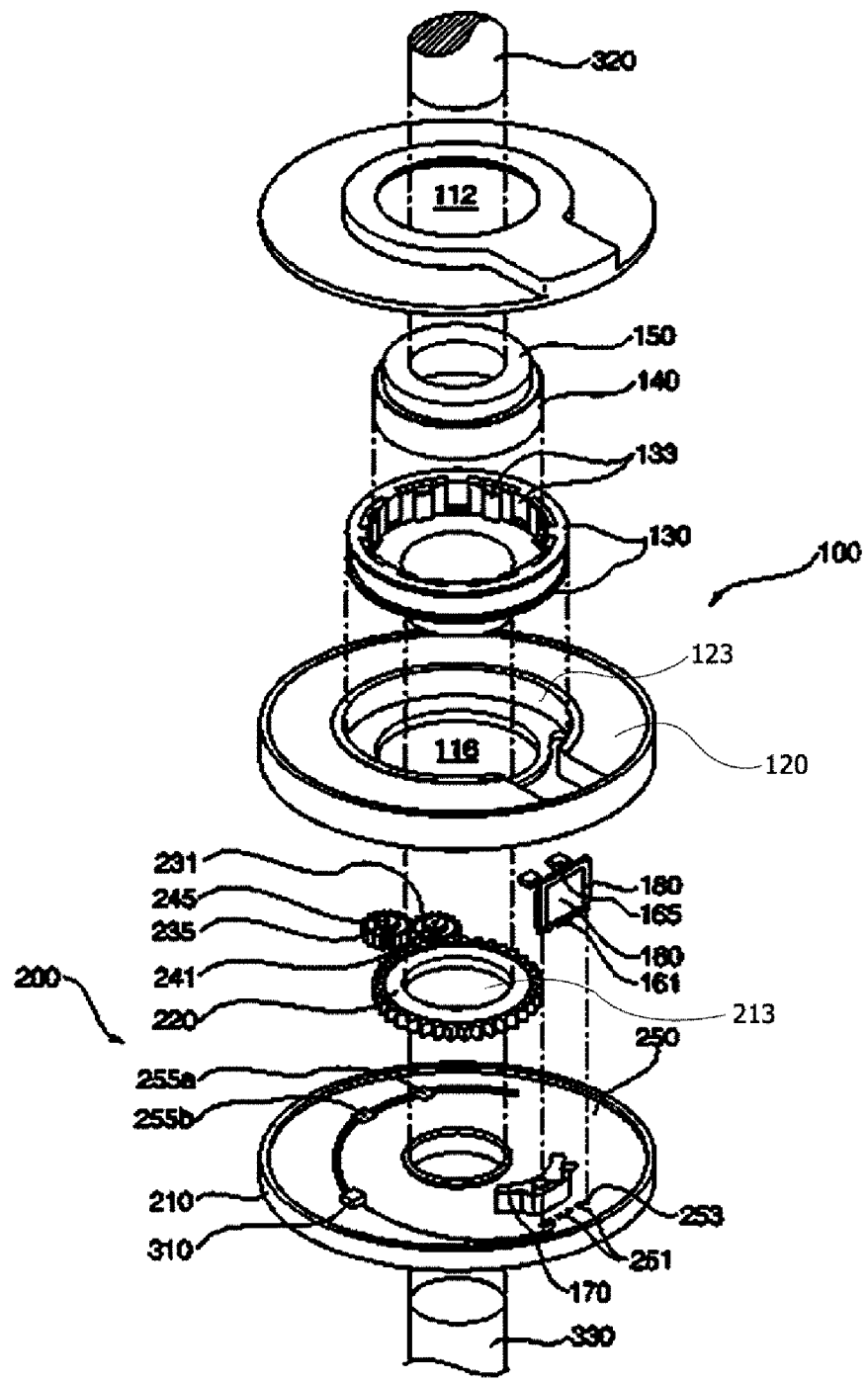
FIG. 2 is an exploded perspective view of FIG. 1.

FIG. 1 is a perspective view of a complex sensing apparatus for a steering system in accordance with an exemplary embodiment of the present invention, and FIG. 2 is an exploded perspective view of FIG. 1.

As shown, the complex sensing apparatus for a steering system in accordance with an exemplary embodiment of the present invention includes a steering torque sensing apparatus 100 and a steering angle sensing apparatus 200.

The steering torque sensing apparatus 100 includes a cylindrical housing 110 having a bracket 111 and a cover 115 coupled to each other to form a predetermined space therebetween. Here, the bracket 111 is disposed at a lower side of the housing 110 and the cover 115 is disposed at an upper side of the housing 110 in a vertical direction thereof. The bracket 111 and the cover 115 have first and second through-holes 112 and 116 correspondingly formed at center parts thereof, respectively.

Hereinafter, in designating surfaces of elements, with respect to the vertical direction of the housing 110, a surface and a direction directed upward are referred to as "an upper surface and an upper side", and a surface and a direction directed downward are referred to as "a lower surface and a lower side."

A cylindrical stator holder 120 is installed in the housing 110, and stators 130 are coupled to an upper end surface and a lower end surface of the stator holder 120, respectively.

A first ring-shaped magnet 140 having a plurality of polarities is disposed inside the stator 130 such that an outer circumference of the first magnet 140 faces teeth 133 of the stator 130 at a predetermined interval.

The first magnet 140 is coupled to an outer circumference of a magnet holder 150 having a cylindrical inner circumference, and an input shaft 320 disposed at a steering shaft side and passing through the second through-hole 116 of the cover 115 is coupled to the inner circumference of the magnet holder 150.

A coupling tube 123 projecting from a lower side of the stator holder 120 passes through the first through-hole 112 of the bracket 111 to be exposed from a lower side of the housing 110, and an output shaft 330 disposed at a steering wheel side is connected to the inner circumference. The input shaft 320 and the output shaft 330 are connected to each other by a torsion bar (not shown).

Therefore, when an external force is applied to a steering wheel to rotate it, the input shaft 320 is rotated, and the magnet holder 150 and the first magnet 140 are also rotated with the input shaft 320. Then, the output shaft 330 receives a rotational force of the input shaft 320 through the torsion bar to be rotated, and the stator holder 120 and the stator 130 are rotated with the output shaft 330.

However, since the output shaft 330 is connected to the steering wheel in contact with a road, a torque is generated in the torsion bar by a friction resistance between the road and the steering wheel. Due to the torque from the torsion bar, rotation angles of the first magnet 140 and the stator 130 are different from each other. According to a difference in rotation angle of the first magnet 140 and the stator 130, a magnetic field induced between the first magnet 140 and the stator 130 varies.

The magnetic field generated between the first magnet 140 and the stator 130 is detected by a first sensor 165 installed at a first PCB 160. Accordingly, an intensity of the magnetic field detected by the first sensor 165 is received by a microcomputer 310 installed at a case 210 of the steering angle sensing apparatus 200, which will be described later, the received value is compared with a reference value to measure a torque, and an auxiliary operation force required to steer the vehicle is determined according to the measured torque to drive a motor, etc.

The steering angle sensing apparatus 200 includes the case 210 having an open upper surface and coupled to a lower surface of the bracket 111. A third through-hole 213 is formed in the lower surface of the case 210, and the output shaft 330 passes through the third through-hole 213 to be coupled to the inner circumference of the coupling tube 123.

A main gear 220 is coupled to an outer circumference of the coupling tube 123 to be rotated with the stator holder 120. The main gear 220 is engaged with a first auxiliary gear 231, and the first auxiliary gear 231 is engaged with a second auxiliary gear 235 having a different gear ratio from the first auxiliary gear 231. The first and second auxiliary gears 231 and 235 are coupled to the lower surface of the bracket 111 to be supported by the bracket 111.

Second and third magnets 241 and 245 are coupled to center parts of the first and second auxiliary gears 231 and 235 to be rotated with the first and second auxiliary gears 231 and 235.

In addition, a second PCB 250 is installed at the lower surface of the case 210, and second and third sensors 255a and 255b are installed at the second PCB 250 to oppose the second and third magnets 241 and 245. The second and third sensors 255a and 255b sense rotational angles of the second and third magnets 241 and 245 to send the rotational angles to the microcomputer 310 installed at the second PCB 250.

Reference numeral 170 in FIG. 2 designates a collector configured to collect a magnetic field of the stator 130. The collector 170 is also installed at the cover 115 to collect the magnetic field of the stator 130.

The first PCB 160 is installed at the second PCB 250 and connected thereto at its one end to be disposed perpendicular to the second PCB 250. However, when the first PCB 160 is not securely coupled to the second PCB 250, the first PCB 160 may be separated from the second PCB 250 or poorly connected to the second PCB 250.

Figure 3:
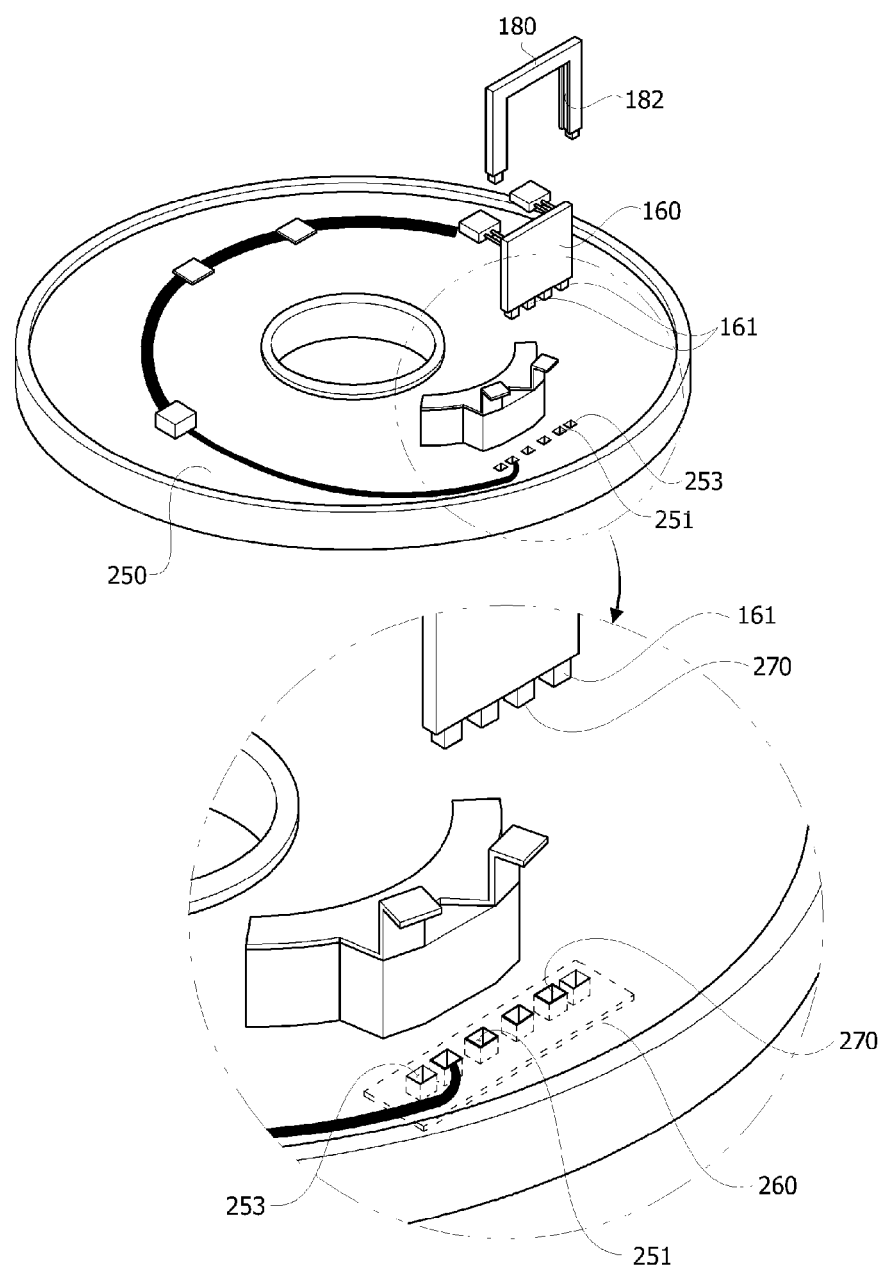
FIG. 3 is an enlarged exploded perspective view of first and second PCBs shown in FIG. 2.

The complex sensing apparatus for a steering system in accordance with the exemplary embodiment of the present invention is configured to securely install the first PCB 160 at the second PCB 250, which will be described with reference to FIGS. 2 and 3. FIG. 3 is an enlarged exploded perspective view of the first and second PCBs.

As shown, a plurality of insertion projections 161 and a plurality of through-holes 251 are correspondingly formed in one end of the first PCB 160 and the second PCB 250 to be press-fitted to each other. That is, since the insertion projections 161 and the through-holes 251 are press-fitted to each other in a concave and convex shape, the first PCB 160 is securely coupled to the second PCB 250.

Since the first and second PCBs 160 and 250 must be electrically connected to each other, copper foils 270 are formed on outer surfaces of the insertion projections 161 and inner circumferences of the through-holes 251. In addition, in order to securely connect the first PCB 160 to the second PCB 250, the insertion projections 161 are inserted into the through-holes 251 and then soldered thereto. That is, the copper foils 270 formed on the outer surfaces of the insertion projections 161 and the copper foils 270 formed on the inner circumferences of the through-holes 251 are soldered to each other.

A pad 260, at which ends of the insertion projections 161 inserted into the through-holes 251 are contact-supported, may be coupled to the lower surface of the second PCB 250 having the through-holes 251. The pad 260 prevents the ends of the insertion projections 161 from being exposed to the outside of the second PCB 250.

In order to more securely couple the first PCB 160 to the second PCB 250, a support member 180 is installed at the second PCB 250 to surround and support an edge of the first PCB 160.

The support member 180 is formed in a frame shape having one open side corresponding to a profile of the first PCB 160 to surround the edge of the first PCB 160 exposed to the outside, with no contact with the second PCB 250.

Here, an insertion channel 182 is formed in the inner surface of the support member 180 having a frame shape such that the edge of the first PCB 160 is inserted. In addition, both ends of the support member 180 are press-fitted into the second PCB 250, and the second PCB 250 has coupling holes 253 into which both ends of the support member 180 are inserted. Accordingly, the first PCB 160 is more securely coupled to the second PCB 150 by the support member 180.

Both ends of the support member 180 inserted into the coupling holes 253 may be soldered to the second PCB 250.

As can be seen from the foregoing, in a complex sensing apparatus in accordance with the present invention, since insertion projections of a first PCB are inserted into through-holes of a second PCB to be press-fitted to each other, the first PCB is securely coupled to the second PCB. In addition, since the support member configured to surround and support the edge of the first PCB is coupled to the second PCB, the first PCB is more securely coupled to the second PCB. Accordingly, since there is no probability of separating the first PCB from the second PCB and there is no probability of occurrence of cracks in a soldered part between the first and second PCBs, reliability of products can be improved.

While the invention has been shown and described with reference to certain example embodiments thereof, it will be understood by those skilled in the art that various changes in form and details may be made therein without departing from the spirit and scope of the invention as defined by the appended claims.

What is claimed is:

1. A complex sensing apparatus for a steering system, comprising:
 a first printed circuit board (PCB) at which a sensor for detecting a steering torque is installed; and
 a second PCB perpendicularly disposed at the first PCB and at which a sensor for detecting a steering angle is installed,
 wherein an insertion projection is formed at an end of the first PCB and a through-hole is formed in the second PCB to correspond to the insertion projection such that the insertion projection is press-fitted into the through-hole, wherein a support member is coupled to the second PCB to surround and support an edge of the first PCB, wherein the support member has a frame shape with one open side, wherein the support member surrounds the edge of the first PCB exposed to the outside, and wherein both ends of the support member are press-fitted into coupling holes formed in the second PCB.

2. The complex sensing apparatus for a steering system according to claim 1, wherein copper foils are formed on an outer surface of the insertion projection and an inner circumference of the through-hole, and the insertion projection is inserted into the through-hole to be soldered thereto.

3. The complex sensing apparatus for a steering system according to claim 2, wherein a pad by which the end of the insertion projection is contact-supported is coupled to the second PCB having the through-hole.

4. The complex sensing apparatus for a steering system according to claim 1, wherein an insertion channel is formed in an inner surface of the frame-shaped support member such that the edge of the first PCB is inserted thereinto.

5. The complex sensing apparatus for a steering system according to claim 4, wherein the ends of the support member inserted into the coupling holes are soldered to the second PCB.

6. The complex sensing apparatus for a steering system according to claim 5, wherein a pad by which the end of the insertion projection is contact-supported is coupled to the second PCB having the through-hole.

7. The complex sensing apparatus for a steering system according to claim 4, wherein a pad by which the end of the insertion projection is contact-supported is coupled to the second PCB having the through-hole.

8. The complex sensing apparatus for a steering system according to claim 1, wherein a pad by which the end of the insertion projection is contact-supported is coupled to the second PCB having the through-hole.

9. The complex sensing apparatus for a steering system according to claim 1, wherein a pad by which the end of the insertion projection is contact-supported is coupled to the second PCB having the through-hole.

* * * * *